United States Patent
Chen et al.

(10) Patent No.: US 6,939,784 B2
(45) Date of Patent: Sep. 6, 2005

(54) WAFER SCALE PACKAGE AND METHOD OF ASSEMBLY

(75) Inventors: Li-Shu Chen, Ellicott City, MD (US); Philip C. Smith, Ellicott City, MD (US); Thomas J. Moloney, Ellicott City, MD (US); Howard Fudem, Baltimore, MD (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 10/820,761

(22) Filed: Apr. 9, 2004

(65) Prior Publication Data

US 2004/0191957 A1 Sep. 30, 2004

Related U.S. Application Data

(62) Division of application No. 10/396,572, filed on Mar. 26, 2003, now Pat. No. 6,812,558.

(51) Int. Cl.[7] .......................... H01L 21/30; H01L 21/48
(52) U.S. Cl. ........................ 438/456; 438/113; 438/458
(58) Field of Search .................... 438/106, 110, 438/113, 125, 455, 456, 458, 114, 51, 55, 64–68

(56) References Cited

U.S. PATENT DOCUMENTS

| | | | | |
|---|---|---|---|---|
| 5,448,014 A | | 9/1995 | Kong et al. | |
| 5,668,033 A | * | 9/1997 | Ohara et al. | 438/113 |
| 6,383,833 B1 | * | 5/2002 | Silverbrook | 438/51 |
| 6,452,238 B1 | * | 9/2002 | Orcutt et al. | 257/415 |
| 6,479,314 B2 | * | 11/2002 | Shibahara et al. | 438/51 |
| 6,479,320 B1 | * | 11/2002 | Gooch | 438/109 |
| 6,559,487 B1 | * | 5/2003 | Kang et al. | 257/254 |
| 6,677,187 B2 | * | 1/2004 | Salaville | 438/125 |
| 6,777,263 B1 | * | 8/2004 | Gan et al. | 438/106 |
| 6,784,020 B2 | * | 8/2004 | Lee et al. | 438/106 |
| 2002/0000646 A1 | | 1/2002 | Gooch et al. | |
| 2002/0179986 A1 | | 12/2002 | Orcutt et al. | |
| 2004/0077117 A1 | * | 4/2004 | Ding et al. | 438/51 |

* cited by examiner

Primary Examiner—Ha Tran Nguyen
Assistant Examiner—Scott B. Geyer
(74) Attorney, Agent, or Firm—Birch, Stewart, Kolasch & Birch, LLP

(57) ABSTRACT

A plurality of electronic circuits and associated signal lines are positioned at respective locations on a base wafer. A cover wafer, which fits over the base wafer, includes a corresponding like number of locations each including one or more cavities to accommodate the electronic circuit and associated signal lines. The cover wafer includes a plurality of vias for making electrical connection to the signal lines. A multi layer metallic arrangement hermetically seals the periphery of each location as well as sealing the bottom of each via. The joined base and cover wafers may then be diced to form individual die packages.

14 Claims, 6 Drawing Sheets

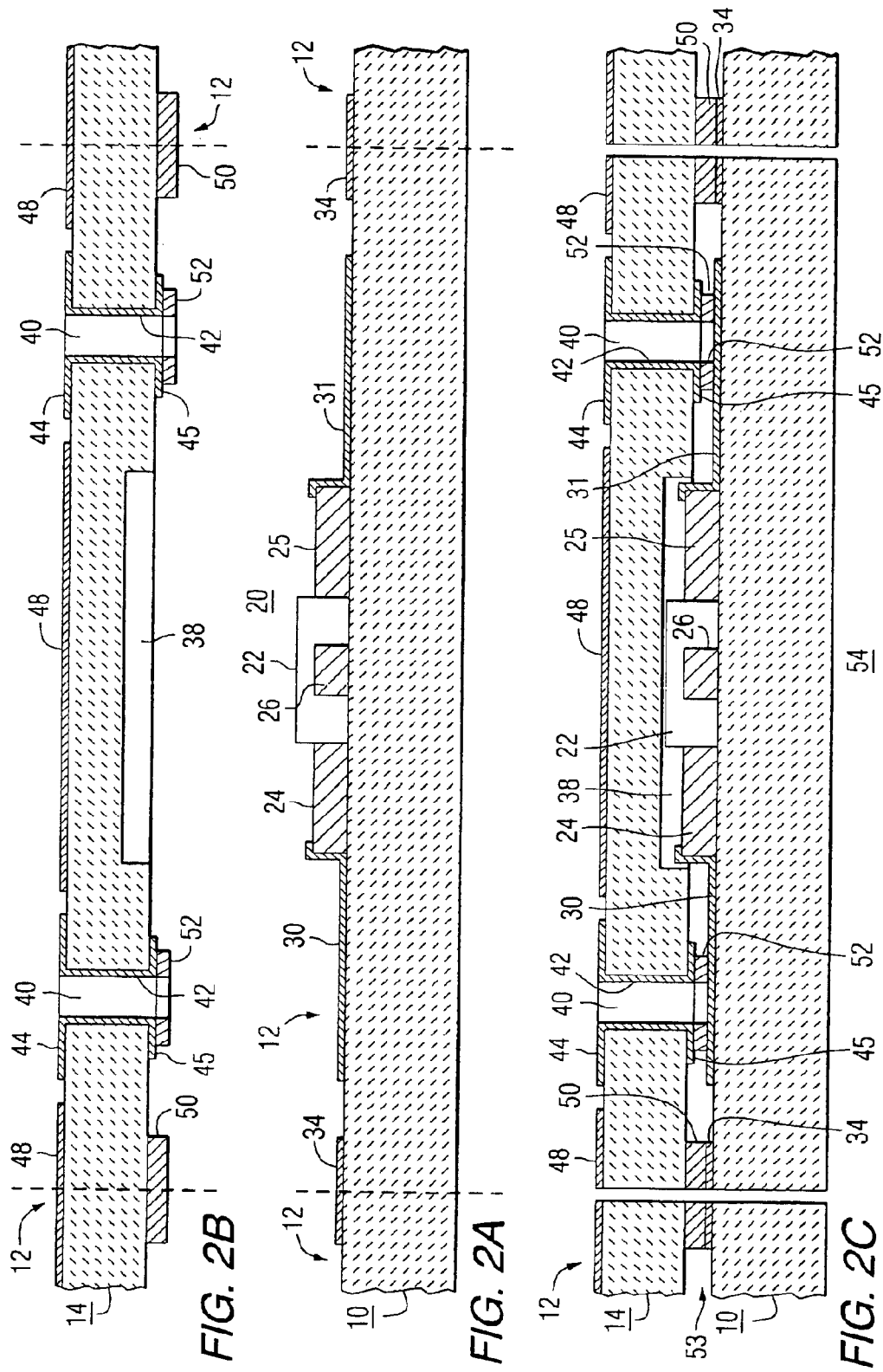

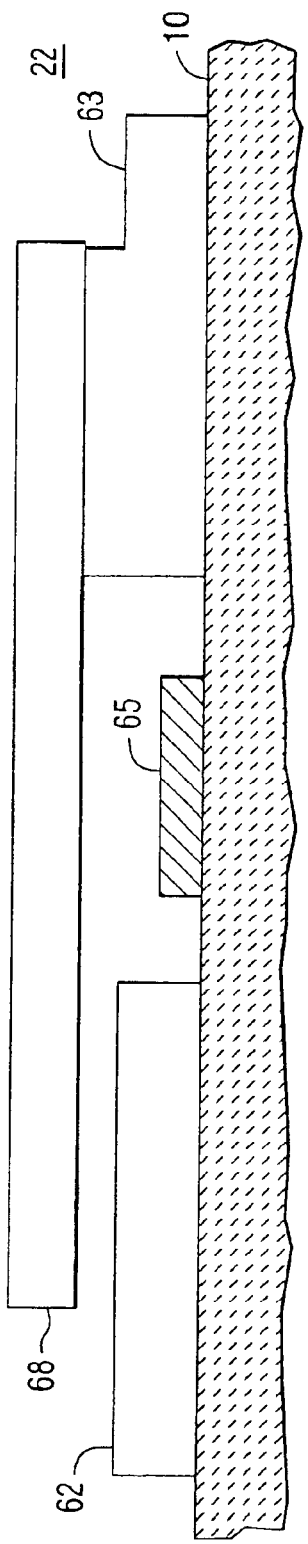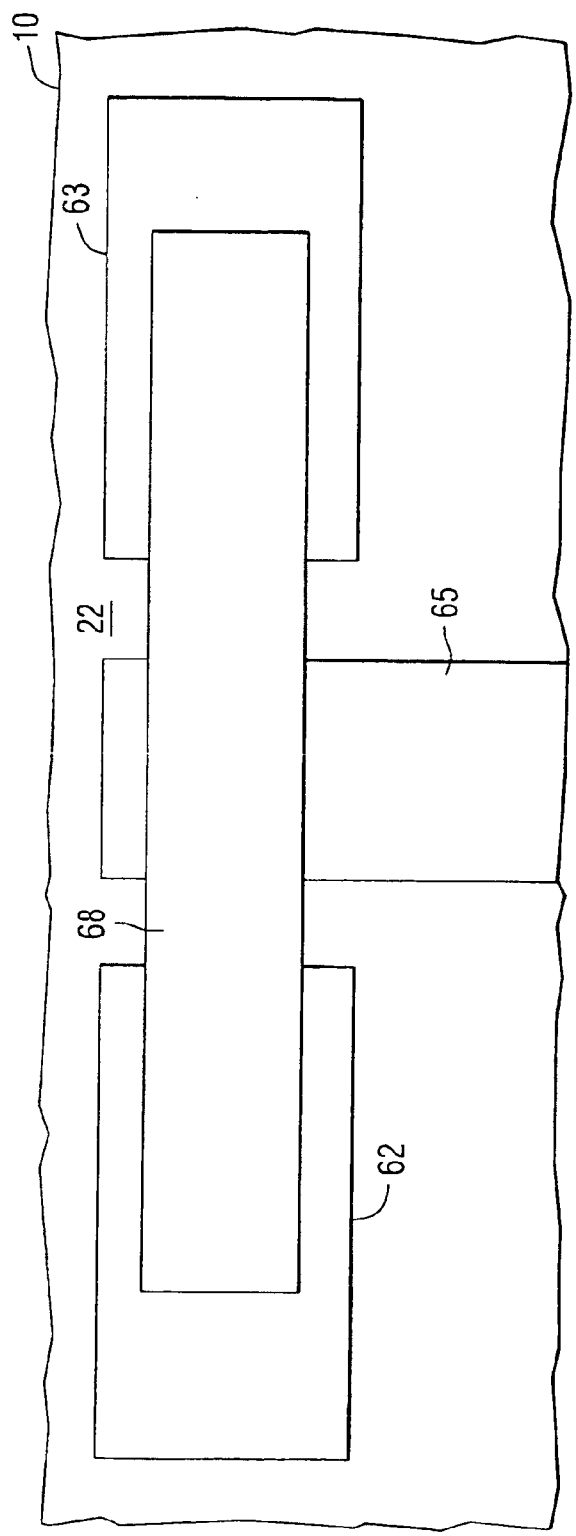

WAFER SCALE PACKAGE AND METHOD OF ASSEMBLY

ORIGIN OF THE INVENTION

This application is a Division of U.S. Ser. No. 10/396,572, filed in the United States Patent and Trademark Office on Mar. 26, 2003 now U.S. Pat.No. 6,812,558, and is assigned to the same assignee as Ser. No. 10/396,572.

BACKGROUND OF THE INVENTION

1. Field of the Invention

The invention in general relates to the packaging of electronic circuits, and particularly to those including MEMS devices.

2. Description of Related Art

A variety of MEMS (microelectromechanical systems) switches are in use, or proposed for use, in biomedical systems, in radar and communication systems, as well as other high frequency circuits for controlling RF signals. These MEMS switches are popular insofar as they can have a relatively high off impedance, with a low off capacitance, and a relatively low on impedance, with a high on capacitance, leading to desirable high cutoff frequencies and wide bandwidth operation. Additionally, the MEMS switches have a small footprint, can operate at high RF voltages and are compatible with conventional integrated circuit fabrication techniques.

For example, electronic circuits including MEMS switches are generally fabricated and tested on a large scale wafer which is subsequently cut up (diced) into individual circuits. These individual circuits are then packaged and placed into other systems.

Many of these MEMS switches generally have electrostatic elements, such as opposed electrodes, which are attracted to one another upon application of a pull down control voltage. At least one of these pull down electrodes is on the wafer and an opposing electrode is defined on the underside of a moveable bridge, or cantilever, above the wafer. Upon application of the pull down control voltage, the bridge, or cantilever is deflected down and the electrical impedance is severely reduced (either by capacitive coupling or by direct ohmic contact), between first and second spaced apart RF conductors on the wafer thus allowing a signal to propagate between the first and second RF conductors.

In view of the fact that these MEMS switches have electrically movable components, such as the bridge, it is imperative that movement of these components be completely unimpeded. However, after the fabrication process, in a wafer processing clean room, it is possible that unwanted debris blocks the normal movement of the bridge. This debris can occur particularly as a result of the dicing and packaging steps or in an application environment.

The MEMS device is not only sensitive to air borne particulates but also to moisture to which the MEMS device may be subject after it leaves the wafer processing clean room.

The present invention provides for a wafer scale packaging resulting in a hermetically sealed unit which eliminates the problems of conventional fabrication. In addition, the present invention is conducive to assembly under desired controlled ambient conditions.

SUMMARY OF THE INVENTION

A wafer scale package for electronic circuits is described and includes a base wafer having a plurality of locations each accommodating an electronic circuit, each circuit including at least one electronic device and associated signal lines. A cover wafer is provided having a corresponding like plurality of locations each including at least one cavity of sufficient size to accommodate the electronic device. Each location of the cover wafer includes a plurality of electrically conducting vias for establishing electrical continuity with the signal lines, at the bottom of the vias. A multilayer metallic seal surrounds each location to provide a peripheral hermetic seal and a multilayer metallic seal surrounds each bottom of the vias to provide a via hermetic seal. The peripheral hermetic seal is of sufficient width to enable dicing along the peripheral hermetic seal to form individual die packages, each containing a hermetically sealed electronic circuit.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only. In addition, the use of spatial terms such as top, bottom, above, below etc. is for ease of explanation and not as structural or orientation limitations.

FIG. 2A is a cross-sectional view of a portion of a processed base wafer.

FIG. 2B is a cross-sectional view of a portion of a processed cover wafer.

FIG. 2C is a cross-sectional view of a portion of a processed cover wafer joined with a base wafer.

FIG. 3A is a side view, partially in cross-section of a MEMS switch.

FIG. 3B is plan views of the MEMS switch of FIG. 3A.

DESCRIPTION OF THE PREFERRED EMBODIMENT

Figure 1A:
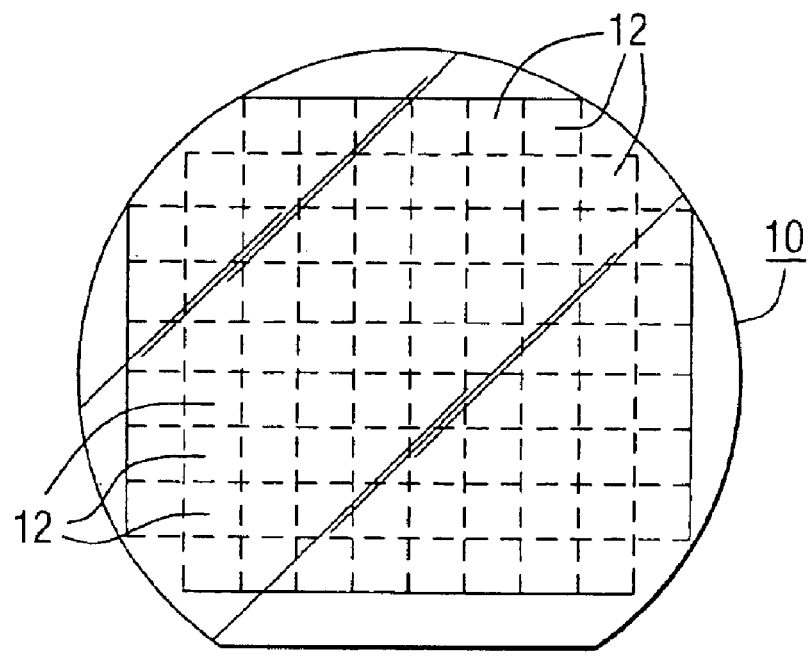
FIG. 1A is a view of a base wafer in accordance with one aspect of the present invention and FIG. 1B is a view of a cover wafer.

Referring now to FIG. 1A, there is illustrated a wafer 10 divided into a plurality of dies or locations 12, as indicated by the dotted lines. Wafer 10 is referred to herein as the base wafer, and locations 12 will each accommodate an electronic circuit, with each such electronic circuit including at least one electronic device. The various locations may have identical electronic circuits or the wafer may include a variety of different circuits.

Figure 1B:
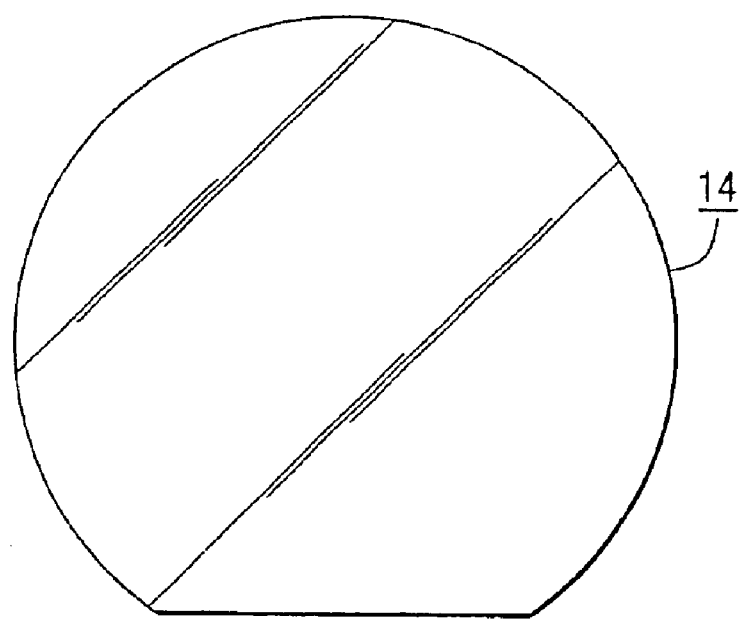

FIG. 1B illustrates a plan view of a cover wafer 14, which also includes a like plurality of corresponding locations (on the undersurface and not seen in FIG. 1B). The base and cover wafers 10 and 14 may be of any suitable material, however, in the described example to follow, quartz is utilized.

Figure 5:
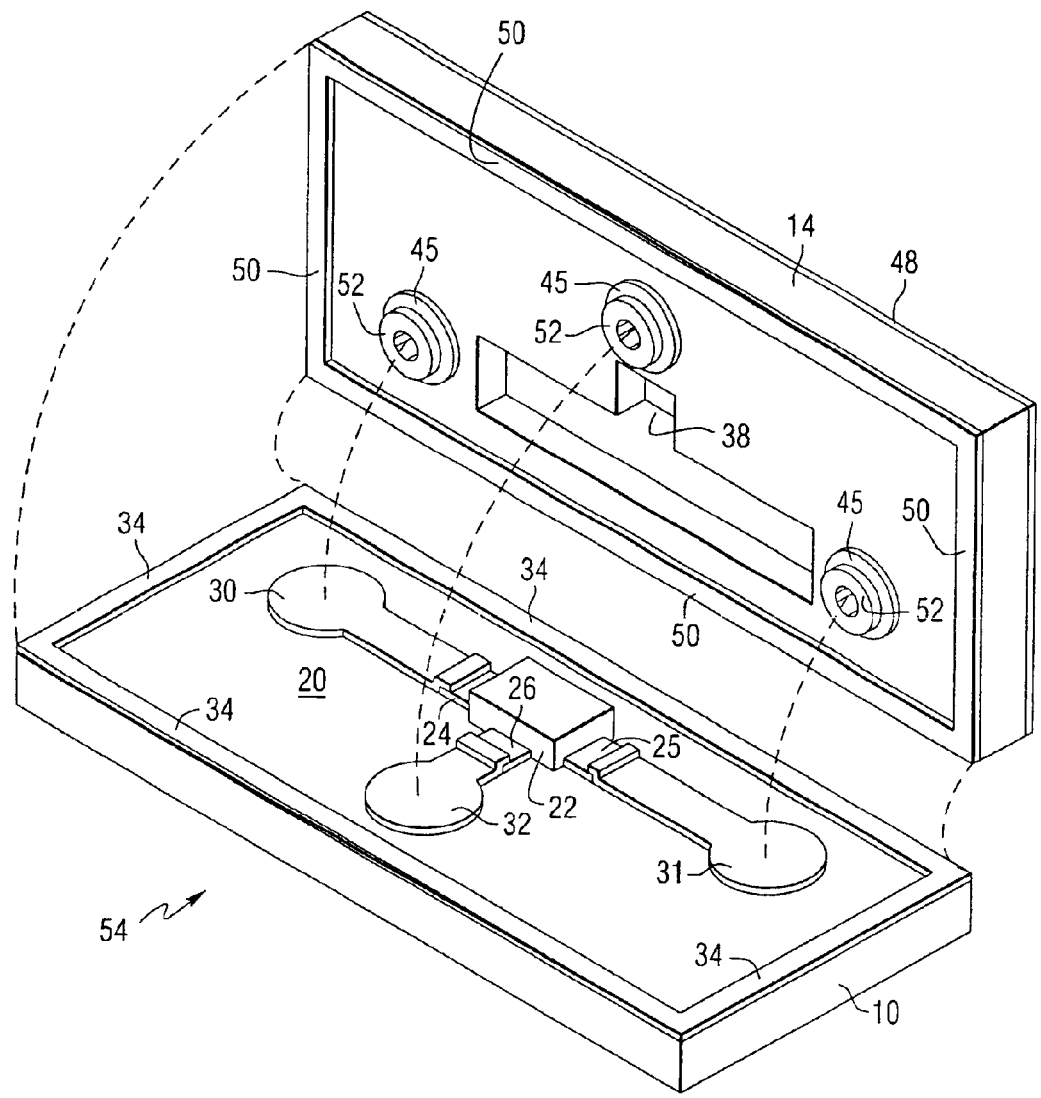
FIG. 5 is an exploded view of the arrangement of FIG. 2C.

In FIG. 2A there is illustrated one complete location 12 of base wafer 10, which includes an electronic circuit 20 having at least one electronic device 22. Electronic device 22 has a plurality of signal lines 24, 25 and 26 deposited on the wafer 10. The term "signal line" as used herein is meant to include information carrying lines, as well as any bias, control or delay lines, etc., if used, for a particular electronic circuit. Other electronic circuits would be positioned at adjacent locations separated by the vertical dotted lines A pad metalization 30 is deposited on base wafer 10 and makes electrical contact with line 24 and pad metalization 31 is deposited and makes electrical contact with line 25. Not seen in FIG. 2A, but rather in FIG. 5, is a third pad metalization 32 making electrical contact with line 26.

Another metalization 34 straddles the juncture between adjacent locations 12, and completely surrounds the location. This will form part of a die package peripheral hermetic seal, when the assembly process (to be described) is completed. For ease of fabrication and to reduce processing costs, the pads 30, 31 and 32, and peripheral seal metalization 34 may be constituted of the same metal layers and may be applied in the same process step.

FIG. 2B illustrates the cover wafer 14 which will seal with the base wafer 10. Each location of cover wafer 14 includes at least one cavity 38, formed for example by etching, and of sufficient size to accommodate at least the electronic device 22, and preferably, the electronic device as well as any signal lines.

Extending from the top surface to the bottom surface of the wafer 14 are a plurality of vias 40 each having a metal deposition 42 on the inner wall thereof. A top via pad 44 and bottom via pad 45 are electrically integral with the via wall metal deposition 42. For RF applications, a ground plane 48 is provided on the top surface of the cover wafer 14 and surrounds the top via pads 44.

A cover peripheral seal includes metalization 50 which extends completely around the location 12 and is commensurate with peripheral seal metalization 34 on the base wafer 10. In addition, a via seal metalization 52 completely surrounds the bottom of each via 40, and is deposited over the bottom via pad 45. Again, for ease of fabrication and to reduce processing costs, the various metal layers in the peripheral seal 50 may be constituted of the same metal layers (to be described) in the bottom via pad 45 as well as the via seal metalization 52, and may be applied in the same process steps.

FIG. 2C illustrates the joined base and cover wafers 10 and 14 with electronic device 22 and associated lines 24, 25 and 26 being accommodated within the cavity 38 of cover wafer 14. The peripheral seal 53, constituted by metalizations 34 and 50, is formed after bonding resulting from the assembly and processing of the joined wafers at controlled pressure, temperature and time conditions. Seal 53 is of sufficient width to enable dicing along the seal, as indicated, to form an individual die package 54 containing the electronic circuit (or circuits, as the case may be) along with associated signal lines. The peripheral hermetic seal 53 in conjunction with via seals 52 ensure for a completely hermetically sealed device isolated from the surrounding environment. Further, since the device is sealed before dicing, there is no danger from potential contamination from the dicing process.

Potential contamination is an important consideration, particularly if the electronic device 22 has a moving part, such as in a MEMS switch. By way of example, FIGS. 3A and 3B illustrate, in simplified form, one type of MEMS switch which may be used as the electronic device 22, it being understood that other MEMS devices may be incorporated, as well as other non-moving devices.

In FIGS. 3A and 3B, MEMS switch 60 includes an RF conductor arrangement comprised of an input RF conductor 62 and an opposed output RF conductor 63. A pull down electrode 65 is positioned between the conductors. Conductors 62, 63 and 65 correspond respectively to signal lines 24, 25 and 26 of FIG. 2A.

A moveable metallic bridge member in the form of cantilever 68 is electrically connected to one of the conductors, for example output conductor 63, and is positioned over input conductor 62. Cantilever 68 is provided with a voltage reference, for example DC ground, by a connection through output conductor 63.

When a DC pull down voltage is applied to pull down electrode 65, electrostatic attraction causes the cantilever to make contact either directly with input conductor 62, or with an oxide coating thereon, thus completing the RF circuit and allowing signal propagation. When the pull down voltage is removed, the cantilever resumes the position illustrated in FIG. 3A, and the circuit is broken.

Figure 4:
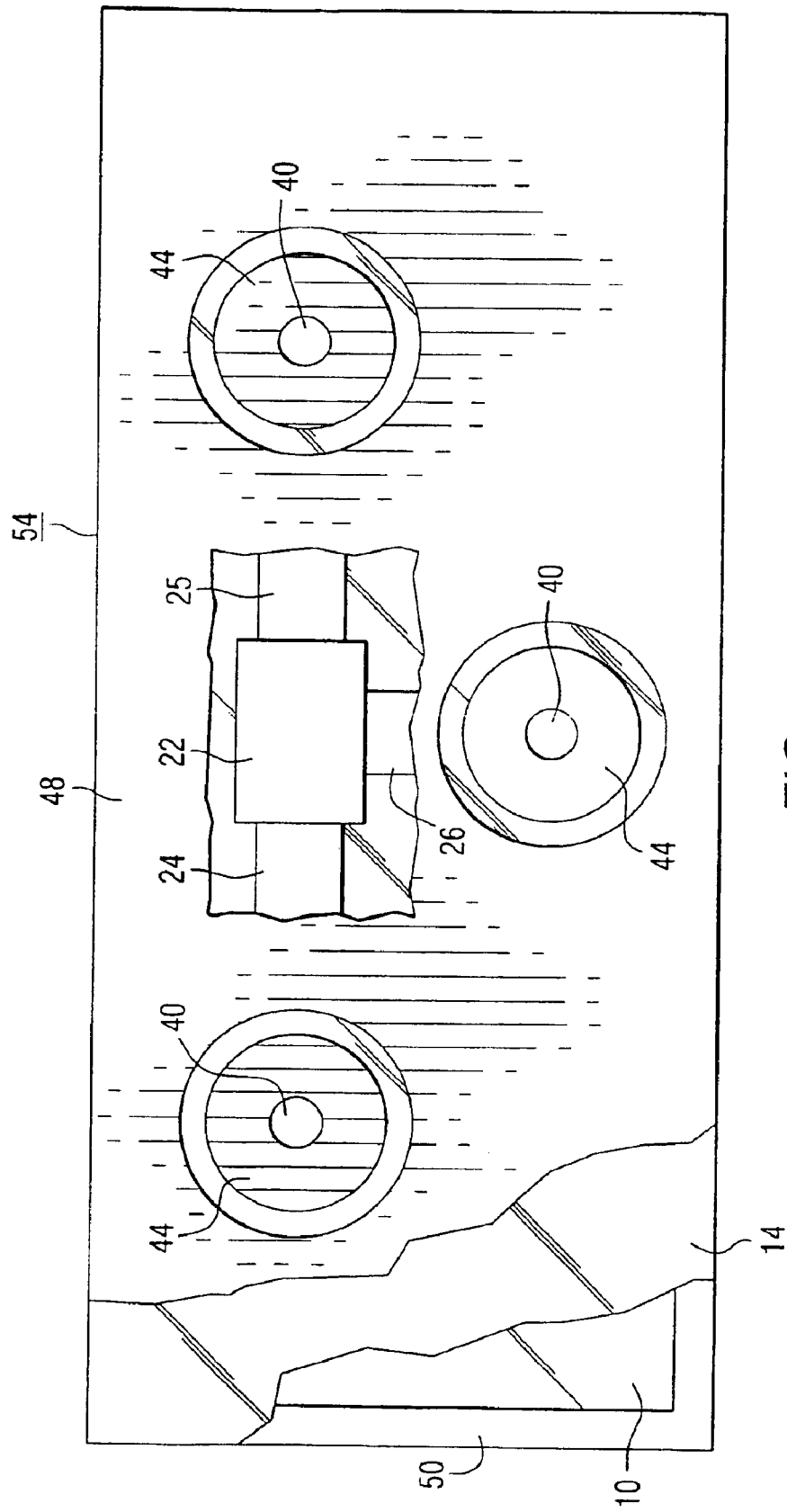
FIG. 4 is a plan view, with portions broken away, of the arrangement of FIG. 2C.

FIG. 4 is a plan view of the individual cut die package 54 containing the electronic circuit 20. Portions of the ground plane 48 and cover wafer 14 have been broken away to present a better view of components. The Fig. illustrates the arrangement of vias 40 and top via pads 44, which allow for testing of the electronic circuit 20 after fabrication (it may also be tested prior to packaging). In addition, the die package 54 will generally be incorporated into a larger electronic system in a manner that the signal lines within the die package 54 will receive the proper signals by means of the various via connections.

FIG. 5 is an exploded isometric view of the die package 54 and better illustrates the cavity 38. Cavity 38 is essentially T-shaped to accommodate the electronic device 22 as well as the three signal lines 24, 25 and 26. For other types of circuits, for example a time delay circuit used for radar beam steering, and including multiple MEMS switches and delay lines, a larger cavity or multiple cavities would be fabricated. FIG. 5 additionally illustrates the nature of the via sealing arrangement. That is, for one embodiment. The via seal 52 is fabricated as a ring, although any other shape which effectively closes off the via opening is possible.

Figure 6:
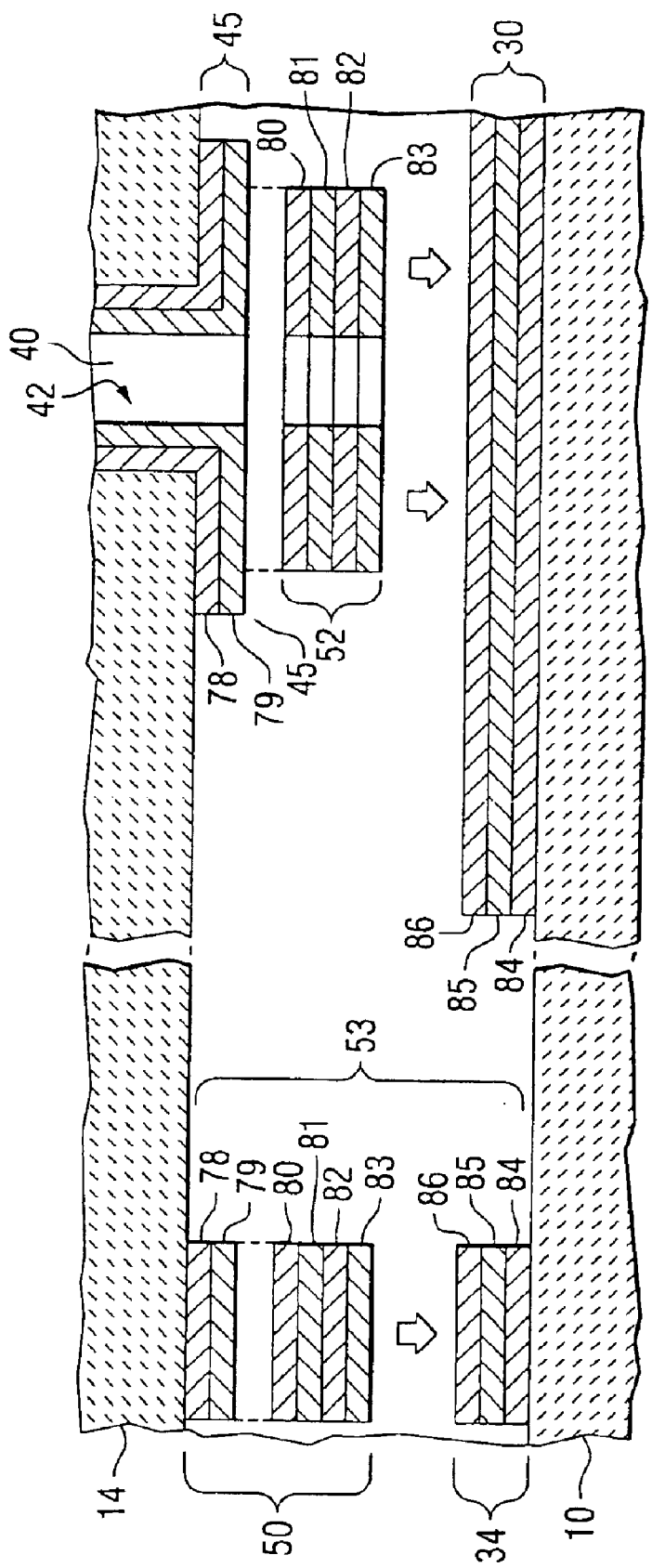
FIG. 6 illustrates a multilayer bond used herein.

FIG. 6 illustrates the sealing arrangement for the die package in more detail. The peripheral hermetic seal, designated by the numeral 53, is comprised of a multi layer metallic structure. Deposited on the undersurface of quartz cover wafer 14, such as by evaporation or sputtering, is a first layer 78 of titanium and a second layer 79 of gold. Titanium is utilized to enhance adhesion of the metallic stack to the quartz.

A bonding metal layer arrangement includes a layer 80 of titanium, a layer 81 of nickel, a layer 82 of indium and a layer 83 of gold. Deposited on the surface of base wafer 10 is a layer 84 of titanium, a layer 85 of nickel and a layer 86 of gold.

As previously stated, the via metal arrangement is formed simultaneously with the metal layer deposition of the peripheral seal. This ensures for planar alignment of the base and cover wafers. Accordingly, the bottom via pad 45 is comprised of metallic layers 78 and 79, the via seal 52 is comprised of metallic layers 80, 81, 82 and 83, and the pad metalization 30 is comprised of metallic layers 84, 85 and 86.

Typical thickness ranges for the metallic layers are as follows:

Layer 78 (Ti):—200–500 Å (Angstroms)
Layer 79 (Au):—1–5 µm (microns)
Layer 80 (Ti):—200–500 Å
Layer 81 (Ni):—2000–5000 Å
Layer 82 (In):—1–2 µm
Layer 83 (Au):—100–300 Å
Layer 84 (Ti):—200–500 Å
Layer 85 (Ni):—2000–5000 Å
Layer 86 (Au):—100–300 Å

After the electronic circuit or circuits, along with associated signal lines have been deposited, and after the base and cover wafers 10 and 14 have been metalized, alignment and bonding apparatus is used to attach the base and cover wafers. This may be accomplished under a pressure of around 30 to 80 psi at a processing temperature of around 120° to 200° C. under vacuum or within an ambient atmosphere such as nitrogen, by way of example. The pressurization time is around 1 to 3 hours.

After the prescribed time, the bonding process is brought to atmospheric pressure and ambient temperature. The described selected metal layers and bonding process results in an exceptionally strong hermetic seal. Post fabrication analysis of the peripheral hermetic seal 53 reveals that the indium and nickel actually fuse together to form an indium-nickel alloy, lending strength to the seal, while the titanium promotes good adhesion to the quartz wafers.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of making a wafer scale package for electronic circuits, comprising the steps of:
    placing electronic circuits each having at least one electronic device and associated plurality of signal lines comprised of at least one metal layer at respective circuit locations on a base wafer;
    forming cavities on an undersurface of a cover wafer at respective circuit locations to accommodate said respective circuit electronic devices, when said wafers are joined;
    forming and metalizing vias in said cover wafer;
    applying at least one initial layer of metal in and on an undersurface of said vias and thereby forming via pads;
    applying at least one initial layer of metal on a top surface of said base wafer around the periphery of each said location; and
    applying at least one initial layer of metal on an undersurface of said cover wafer around the periphery of each said location;
    metalizing a periphery of each said circuit location on said base and cover wafers with at least one intermediate layer of metal;
    metalizing an electric contact between said via pads and said signal lines with at least one intermediate layer of metal;
    wherein the number and thickness of metal layers at the periphery of each said location is substantially equal to the number and thickness of metal layers at said vias and signal lines for ensuring planar alignment of the base and cover wafers when joined together;
    joining said base and cover wafers at predetermined pressure, temperature and time conditions to form a peripheral hermetic seal around each said circuit location and a via hermetic seal around each said bottom of said vias; and
    dicing said joined and sealed wafers along said locations to provide individual die packages.

2. A method of making a wafer scale package according to claim 1 which includes the step of:
    providing a base wafer of quartz.

3. A method of making a wafer scale package according to claim 1 which includes the step of:
    providing a cover wafer of quartz.

4. A method of making a wafer scale package according to claim 1 which includes the step of:
    joining said base and cover wafers at a pressure of around 30 to 80 psi.

5. A method of making a wafer scale package according to claim 1 which includes the step of:
    joining said base and cover wafers at a temperature of around 120° C. to 200° C.

6. A method of making a wafer scale package according to claim 1 which includes the step of:
    joining said base and cover wafers at said predetermined pressure and temperature for around 1 to 3 hours.

7. A method of making a wafer package according to claim 1 wherein said base wafer and said cover wafer are comprised of quartz.

8. A method of making a wafer scale package according to claim 7 wherein said at least one initial layer of metal on the surface of said vias, the top surface of said base wafer and the undersurface of said cover wafer comprises a layer of titanium for enhancing adhesion to said quartz wafers and said vias.

9. A method of making a wafer scale package according to claim 1 wherein said at least one intermediate layer of metal at each said periphery and each of said via pads comprise a plurality of intermediate metal layers including adjacent layers of indium and nickel which fuse so as to become a strength enhancing indium-nickel alloy upon joining said base and cover wafers.

10. A method of making a wafer scale package according to claim 9 and additionally including at least one outer layer of metal adjacent the indium layer and the nickel layer of said intermediate layers.

11. A method of making a wafer scale package according to claim 9 and additionally including an outer layer of metal respectively adjacent the indium layer and the nickel layer of said intermediate layers.

12. A method of making a wafer scale package according to claim 9 wherein the base wafer and cover wafer include at least one additional layer of metal between the respective layers of titanium and said intermediate layers.

13. A method of making a wafer scale package for electronic circuits, comprising the steps of:
    placing electronic circuits each having at least one electronic device and associated signal lines at respective circuit locations on a base wafer comprised of quartz;
    forming cavities on an undersurface of a cover wafer comprised of quartz at respective circuit locations to accommodate said respective circuit electronic devices, when said wafers are joined;
    forming vias in said quartz cover wafer;
    applying an initial metal layer of titanium on an inner surface and an undersurface of said vias;

applying an initial metal layer of titanium on the top surface of the quartz base wafer around the periphery of each said location; and applying an initial metal layer of titanium on the undersurface of the quartz cover wafer around the periphery of each said location;

metallizing a periphery of each said location on said base and cover wafers with a plurality of intermediate metal layers including adjacent layers of indium and nickel;

metallizing an electric contact between a bottom of a said metallized via and said signal lines with a like number of intermediate metal layers also including adjacent layers of indium and nickel;

wherein the number and thickness of metal layers at the periphery of each said location is substantially equal to the number and thickness of metal layers at said vias and signal lines for ensuring planar alignment of the base and cover wafers when joined together;

joining said base and cover wafers at a pressure of about 30 to 80 psi, at a temperature of about 120° C. to 200° C. and for about 1 to 3 hours to form a peripheral hermetic seal around each said circuit location and a via hermetic seal around each said bottom of said via.

14. A method according to claim 11 and additionally including the step of:

dicing said joined and sealed wafers along said locations to provide individual die packages.

* * * * *